United States Patent
Laughlin et al.

(10) Patent No.: US 7,350,985 B2
(45) Date of Patent: Apr. 1, 2008

(54) MINIATURE MT OPTICAL ASSEMBLY (MMTOA)

(75) Inventors: Daric Laughlin, Overland Park, KS (US); Phillip Abel, Overland Park, KS (US)

(73) Assignee: Honeywell Federal Manufacturing & Technologies, LLC, Kansas City, MI (US)

( * ) Notice: Subject to any disclaimer, the term of this patent is extended or adjusted under 35 U.S.C. 154(b) by 0 days.

(21) Appl. No.: 11/690,495

(22) Filed: Mar. 23, 2007

(65) Prior Publication Data

US 2007/0235749 A1 Oct. 11, 2007

Related U.S. Application Data

(60) Provisional application No. 60/785,434, filed on Mar. 24, 2006.

(51) Int. Cl.
G02B 6/36 (2006.01)
(52) U.S. Cl. ........................................................ 385/89
(58) Field of Classification Search .................. 385/89, 385/87, 62, 84, 72
See application file for complete search history.

(56) References Cited

U.S. PATENT DOCUMENTS

| | | | |
|---|---|---|---|
| 5,984,530 A | 11/1999 | Shahid | |
| RE36,820 E | 8/2000 | McGinley et al. | |
| 6,215,555 B1 * | 4/2001 | Chivers | 356/512 |
| 6,499,890 B2 | 12/2002 | Gilliland et al. | |
| 6,502,998 B2 | 1/2003 | Yen et al. | |
| 6,532,157 B1 | 3/2003 | Glenn et al. | |
| 6,769,818 B2 | 8/2004 | Wu | |
| 6,846,115 B1 | 1/2005 | Shang et al. | |
| 6,893,165 B2 * | 5/2005 | Ngo | 385/87 |
| 6,955,482 B2 | 10/2005 | Rosenberg et al. | |

(Continued)

FOREIGN PATENT DOCUMENTS

EP 1028337 A2 * 8/2000

(Continued)

OTHER PUBLICATIONS

Y. Stricot, et al; Moving the Opto-Electronic Interface Inside the Connector; 73; Electronics Engineering 8941, 62; (Apr. 2000).

(Continued)

Primary Examiner—Quyen P Leung
(74) Attorney, Agent, or Firm—Hovey Williams LLP

(57) ABSTRACT

An optical assembly (10) includes a rigid mount (12) with a recess (26) proximate a first side thereof, a substrate (14), and an optical die (16) flip-chip bonded to the substrate (14). The substrate (14) is secured to the first side of the mount and includes a plurality of die bonding elements (40), a plurality of optical apertures (32), and a plurality of external bonding elements (42). A plurality of traces (44) interconnect the die bonding elements (40) and the external bonding elements (42). The optical die (16) includes a plurality of optical elements, each element including an optical signal interface (48), the die being bonded to the plurality of die bonding elements (40) such that the optical signal interface (48) of each element is in registry with an optical aperture (32) of the substrate (14) and the die (16) is at least partially enclosed by the recess (26).

24 Claims, 3 Drawing Sheets

U.S. PATENT DOCUMENTS

| | | |
|---|---|---|
| 7,042,106 B2 | 5/2006 | Lu et al. |
| 2003/0165302 A1* | 9/2003 | Ngo .............................. 385/87 |
| 2007/0140627 A1* | 6/2007 | Lu ............................... 385/89 |

FOREIGN PATENT DOCUMENTS

| | | | | |
|---|---|---|---|---|
| JP | 2001356239 A | * | 12/2001 | |
| JP | 2004317737 A | * | 11/2004 | |
| JP | 2005249941 A | * | 9/2005 | |

OTHER PUBLICATIONS

Seiki Hiramatsu & Masao Kinoshita; Three-Dimensional Waveguide Arrays for Coupling Between Fiber-Optic Connectors and Surface-Mounted Optoelectronic Devices; 22; Journal Of Lightwave Technology 9, 2733; (2005).

* cited by examiner

MINIATURE MT OPTICAL ASSEMBLY (MMTOA)

RELATED APPLICATIONS

The present application is a nonprovisional patent application and claims priority benefit, with regard to all common subject matter, of earlier-filed U.S. provisional patent application titled "MINIATURE MT OPTICAL ASSEMBLY (MMTOA)", Ser. No. 60/785,434, filed Mar. 24, 2006. The identified earlier-filed application is hereby incorporated by reference into the present application.

FEDERALLY SPONSORED RESEARCH OR DEVELOPMENT

The present invention was developed with support from the U.S. government under a contract with the United States Department of Energy, Contract No. DE-ACO4-01AL66850. Accordingly, the U.S. government has certain rights in the present invention.

BACKGROUND

1. Field

Embodiments of the present invention relate to optical-to-electrical and electrical-to-optical transducers and connectors. More particularly, embodiments of the invention involve an assembly for quickly and reliably coupling a mechanically transferrable (MT) connector to an electrical circuit.

2. Description Of Related Art

Fiber optics are increasingly used in communications and networking applications due to the wide bandwidth each optical fiber is capable of carrying and because optical fibers are flexible and can be bundled as cables. When used in fiber-optic communication, for example, optical fibers generally permit digital data transmission over longer distances and at higher data rates than other forms of wired and wireless communications. An optical fiber is a cylindrical dielectric waveguide that transmits light along its axis, by the process of total internal reflection. The fiber consists of a core surrounded by a cladding layer. To confine the optical signal in the core, the refractive index of the core must be greater than that of the cladding.

Use of fiber optics presents challenges, such as the need for precise alignment in optical interconnects. Such interconnects require certain parts to be carefully and precisely placed to ensure optical signals are not interrupted. Interconnects for arrays of optical fibers, for example, are costly and time-consuming to manufacture, requiring each optical element to be precisely aligned.

Accordingly, there is a need for an improved optical interconnect that does not suffer from the problems and limitations of the prior art.

SUMMARY OF THE INVENTION

Embodiments of the present teachings provide an improved optical interconnect that does not suffer from the problems and limitations of the prior art. Particularly, embodiments of the present teachings provide an optical interconnect assembly that does not require active alignment and can be quickly and reliably manufactured.

The optical assembly includes a rigid mount with a recess proximate a first side thereof, a substrate, and an optical die flip-chip bonded to the substrate. The substrate is secured to the first side of the mount and includes a plurality of die bonding elements, a plurality of optical apertures, and a plurality of external bonding elements. A plurality of traces interconnect the die bonding elements and the external bonding elements. The optical die includes a plurality of optical elements, each element including an optical signal interface, the die being bonded to the plurality of die bonding elements such that the optical signal interface of each element is in registry with an optical aperture of the substrate and the die is at least partially enclosed by the recess.

These and other important aspects of the present teachings are described more fully in the detailed description below.

BRIEF DESCRIPTION OF THE DRAWINGS

Preferred embodiments of the present invention are described in detail below with reference to the attached drawing figures, wherein.

DETAILED DESCRIPTION

Figure 1:
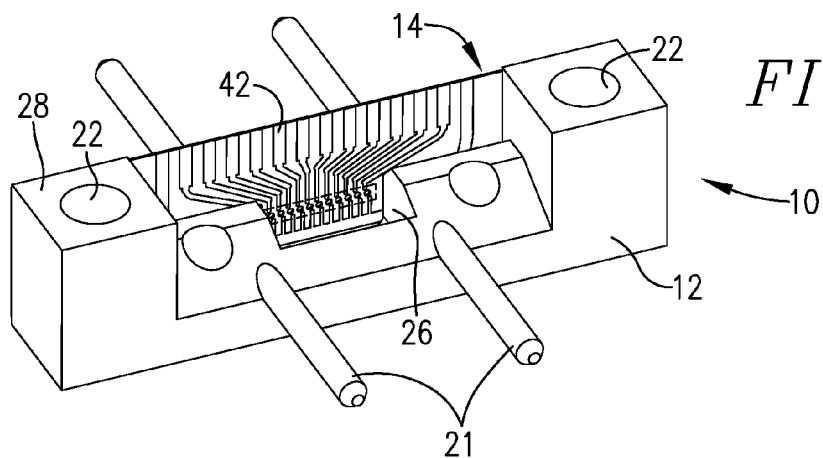
FIG. 1 is a perspective view of an optical assembly constructed according to a first implementation of the present teachings.
Figure 2:
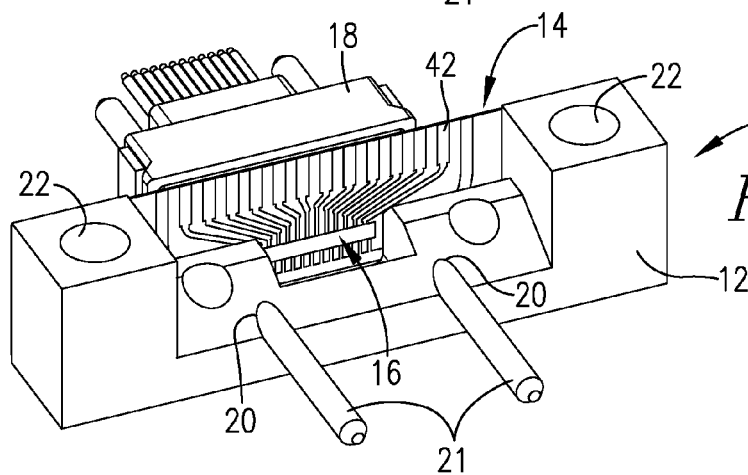
FIG. 2 is a perspective view of the optical assembly of FIG. 1, illustrating an MT connector attached to the assembly.
Figure 3:
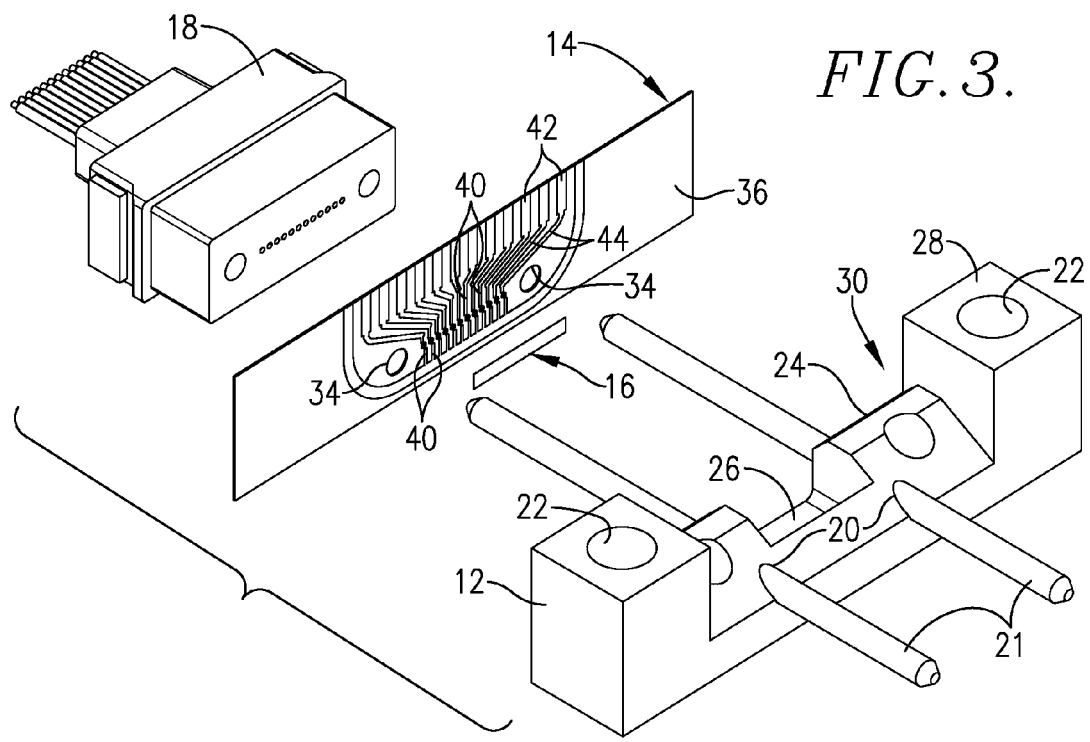
FIG. 3 is an exploded view of the optical assembly of FIG. 2.
Figure 4:
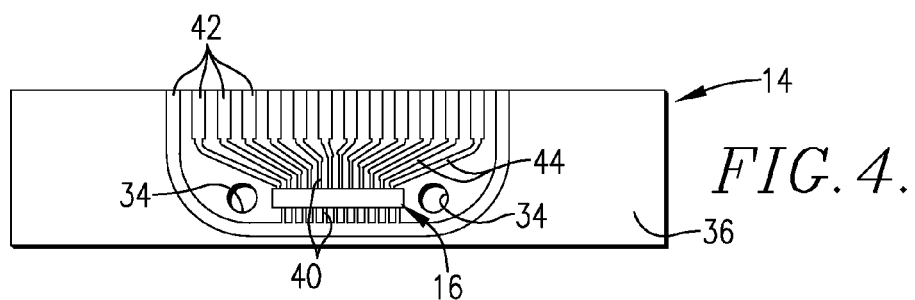
FIG. 4 is a rear elevation view of a substrate of the optical assembly of FIG. 1.
Figure 5:
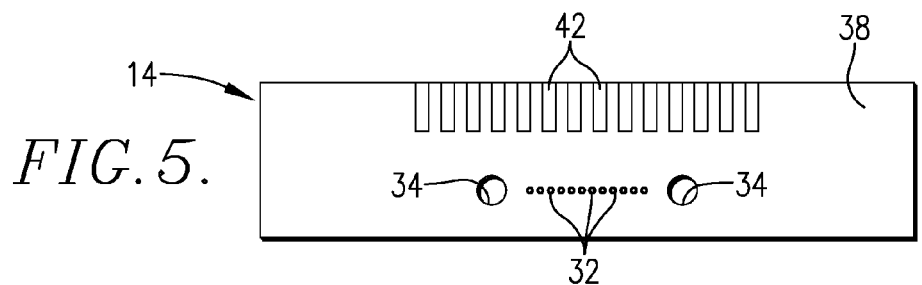
FIG. 5 is a front elevation view of the substrate of FIG. 4.

An optical assembly incorporating principles of the present teachings is illustrated in FIGS. 1-3 and designated generally by the reference numeral 10. The optical assembly 10 generally comprises a mount 12, a substrate 14, and an optical die 16. The assembly 10 generally interconnects an optical mechanically transferable (MT) connector 18 to an electrical circuit, such as a printed circuit board (PCB).

The mount 12 protects and gives rigidity to the substrate 14, protects the die 16, and provides a means for mounting the optical assembly 10 to an external structure, such as an external printed circuit board. Therefore, the mount 12 is preferably substantially rigid and may be constructed of plastic, ceramic, metal, or similar materials.

A plurality of alignment pin holes 20 generally extend from a front of the mount 12 to a back of the mount 12 along a first axis and receive alignment pins 21. As explained below, the alignment pin holes 20 provide a means for aligning the mount 12, the substrate 14, and the MT connector 18. A plurality of mounting holes 22 generally extend from a top of the mount 12 to a bottom of the mount 12 along a second axis. The mounting holes 22 may receive pins, screws, bolts, or other fastening devices to secure the mount 12 to an external structure.

A first side 24 of the mount 12 includes a recess 26 for receiving the optical die 16 when the substrate 14 is bonded to the mount 12. A bottom 28 of the mount 12 includes a bottom recessed portion 30 that exposes a plurality of external bonding pads of the substrate 14, as explained below in greater detail. While the alignment pin holes 20 and the mounting holes 22 are illustrated and described herein as generally being perpendicular to each other, it will be appreciated that alternative, equally preferred implementations may be used according to the demands of a particular situation, all of which are within the ambit of the present technology. For example, in some situations it may be desirable or necessary to position the mounting holes 22 so that they generally extend from a front of the mount 12 to a back of the mount 12 and thus are generally parallel to the alignment pin holes 20.

The substrate 14 supports the optical die 16 and provides one or more circuit elements for electrically interconnecting the optical die 16 with an external circuit, such as an external printed circuit board. The substrate 14 may be a printed circuit board and is sufficiently thin to minimize the divergence of light passing through the substrate and thereby minimizes optical losses during operation. Thus, the thickness of the substrate 14 is related to the optical divergence of the die 16 and the core size of the target optical fiber, such that the preferred thickness of the substrate 14 may vary according to the characteristics of the die 16 and the optical fiber used in MT connector 18.

The substrate 14 may be made from polyimide or a similar polymer or other material capable of enduring the high temperatures associated with solder re-flow processes. The substrate 14 may be a printed circuit board, a thin film network, a thick film network, a low temperature co-fired ceramic material, and so forth. In an exemplary implementation, the substrate 14 thickness is preferably within the range of from about 0.025 mm to about 1.27 mm; more preferably within the range of from about 0.050 mm to about 1.0 mm; and even more preferably within the range of from about 0.075 mm to about 0.75 mm. A thickness of 0.152 mm or less may be desirable, for example, when using a generic optical die and a 0.050 mm core optical fiber. It will be appreciated that other substrate thicknesses may be preferred or required for different types of optical die and/or optical fiber with different core sizes.

The substrate 14 includes an array of optical apertures 32 that allow light to pass through the substrate 14 incident on or generated from the optical die 16. The substrate 14 further comprises a plurality of alignment pin holes 34 that generally correspond to the alignment pin holes 20 of the mount 12 and are generally in registry with the alignment pin holes 20 of the mount 12 when the substrate 14 is bonded to the mount 12. The substrate 14 includes a first side 36 and a second side 38. A plurality of die bonding elements 40, such as solder pads, are located on the first side 36 of the substrate 14 and are used to secure the optical die 16 to the substrate 14. The die bonding elements 40 are positioned relative to the optical apertures 32 so that when the optical die 16 is bonded to the substrate 14 the optical apertures 32 of the substrate 14 are in registry with optical apertures of the die array 16.

In an exemplary implementation, the optical apertures 32 each have a diameter preferably within the range of from about 0.025 mm to about 0.49 mm; more preferably within the range of from about 0.050 mm to about 0.38 mm; even more preferably within the range of from about 0.075 mm to about 0.25 mm; most preferably about 0.152 mm. The center-to-center distance between two consecutive optical apertures 32 depends upon the requirements of the particular implementation but may be, for example, 0.25 mm.

A plurality of external bonding elements 42, such as solder pads, may be located on the first side 36 of the substrate 14, the second side 38, or both. The external bonding elements 42 provide a means for electrically and/or mechanically connecting the substrate 14 to an external structure, such as an external printed circuit board. A plurality of electrical traces 44 interconnect at least some of the die bonding elements 40 to at least some of the external bonding elements 42. When assembled, the first side 36 of the substrate 14 is bonded to the first side 24 of the mount 12 such that the optical die 16 corresponds to the recess 26 of the mount 12.

Figure 6:
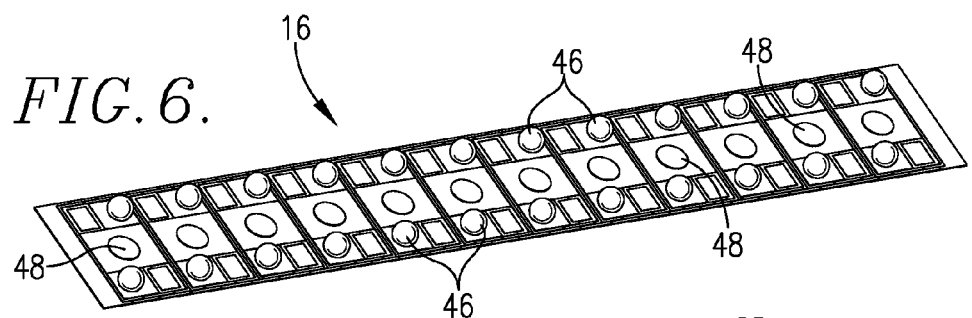
FIG. 6 is a perspective view of an optical die of the optical assembly of FIG. 1.

A perspective view of the optical die 16 is presented in FIG. 6. The optical die 16 includes one or more optical-to-electrical transducer elements, one or more electrical-to-optical transducer elements, or a combination thereof. Exemplary transducer elements may include, for example, a photodiode or a laser diode. A die including a plurality of optical elements presents particular advantages over existing methods of assembling optical array connectors because, for example, a die with an array of elements is aligned and secured as a single entity as opposed to each individual element.

The optical die 16 includes a plurality of solder beads 46 for electrically and mechanically attaching the optical die 16 to the substrate 14. The solder beads 46 may be made of any solder material known in the art, including, for example, Au/Sn, In/Sb, and so forth. The solder beads 46 generally correspond with the die bonding elements 40 of the substrate 14 when the optical die array 16 is placed on the substrate 14.

An optical signal interface 48 associated with each optical element may include an aperture for allowing light to pass into or out of each element of the optical die array 16, and the interfaces 48 are located to be in registry with the optical apertures 32 of the substrate 14 when the optical die array 16 is soldered to the substrate 14, as explained below in greater detail. While the present teachings are generally discussed with reference to an optical die including a plurality of optical elements, it will be appreciated that the present teachings contemplate use of virtually any number of optical elements a single die element.

The die 16 may be virtually any size according to the requirements of the particular implementation. In an exemplary implementation, the optical die 16 preferably has a length within the range of from about 2.5 mm to about 3.6 mm; more preferably from about 2.7 mm to about 3.4 mm; even more preferably from about 2.9 mm to about 3.2 mm; most preferably about 3.15 mm. In the exemplary implementation, the optical die 16 preferably has a width within the range of from about 0.35 mm to about 0.550 mm; more preferably from about 0.40 mm to about 0.5 mm; most preferably about 0.45 mm. The solder beads 46 may vary in size from one implementation to another according to the requirements of each implementation, but may be about 0.60 mm high and about 0.80 mm in diameter.

Figure 7:
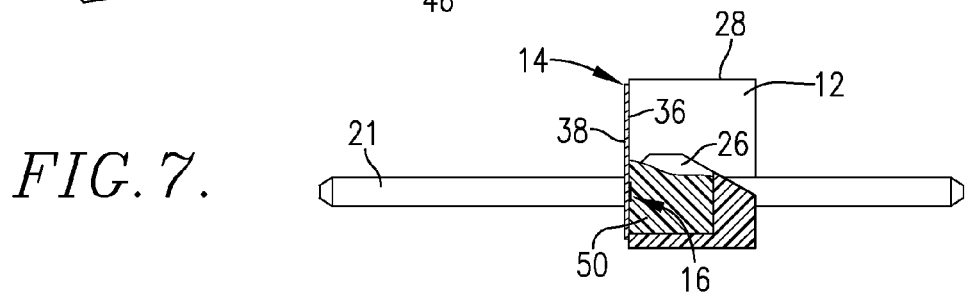
FIG. 7 is a side cross sectional view of the optical assembly of FIG. 1.
Figure 8:
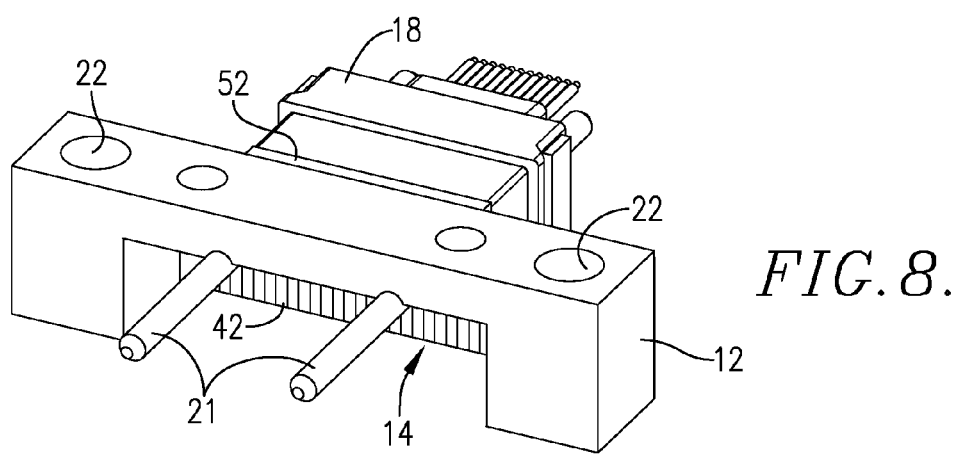
FIG. 8 is a rear perspective view of an optical assembly constructed according to a second implementation of the present teachings and including an optical lens array.
Figure 9:
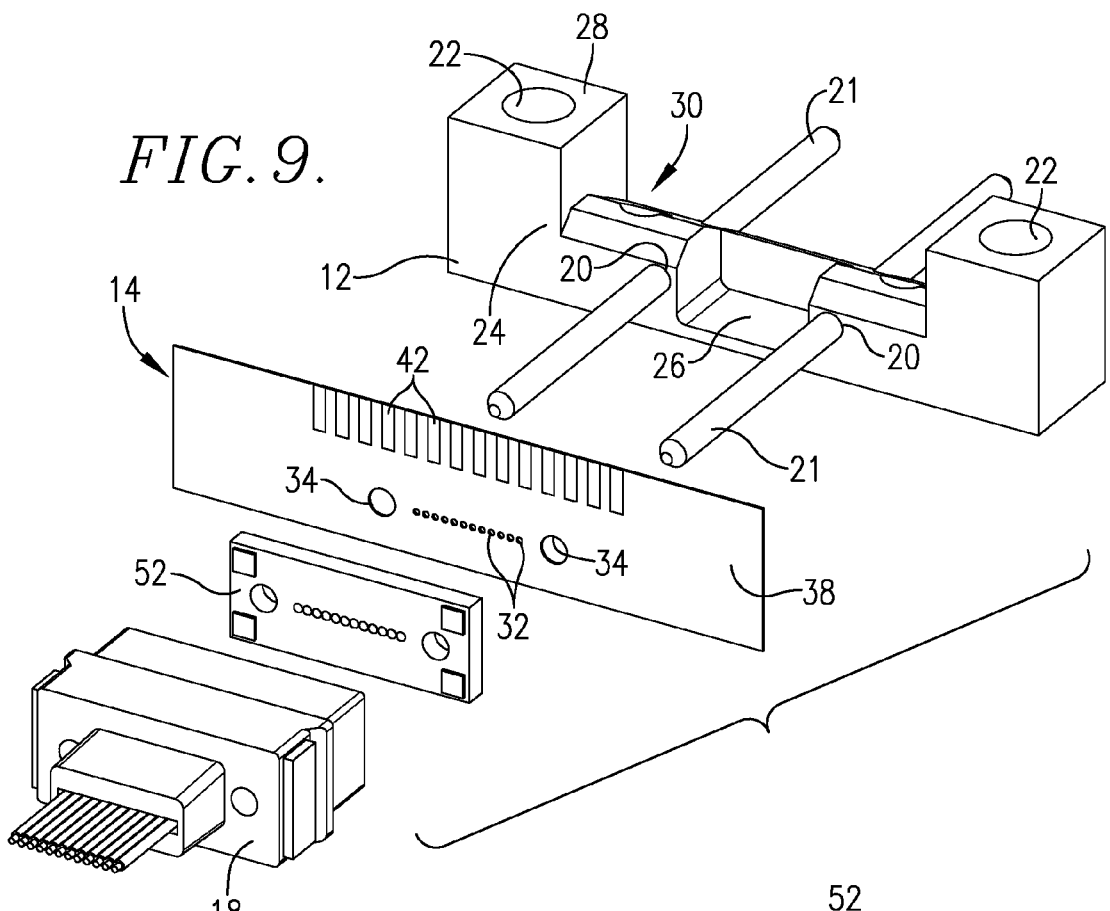
FIG. 9 is an exploded view of the optical assembly of FIG. 8.
Figure 11:
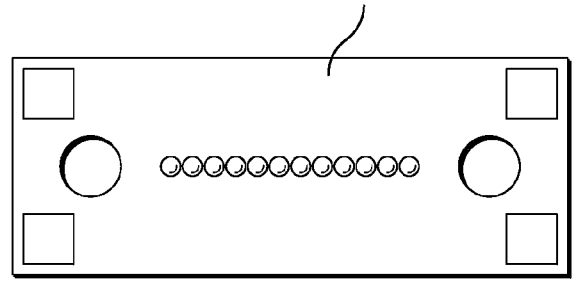
FIG. 11 is a front elevation view of the lens array of the optical assembly of FIG. 8.
Figure 10:
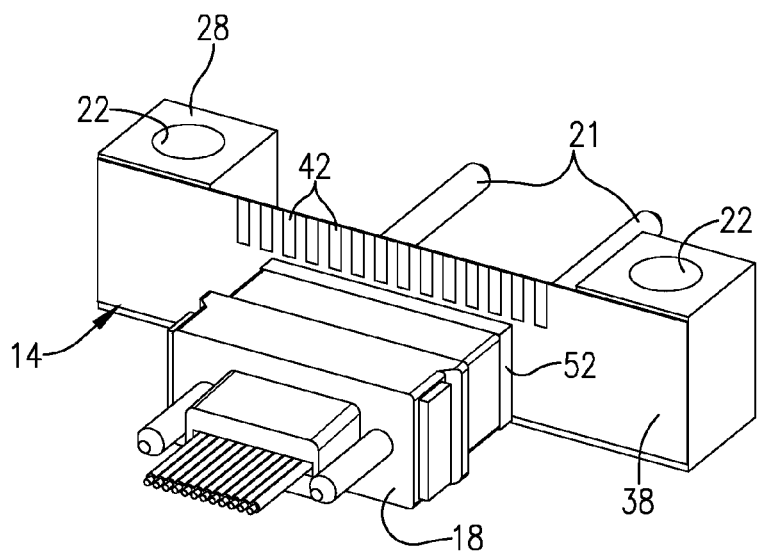
FIG. 10 is a front perspective view of the optical assembly of FIG. 8.

A side elevation cross sectional view of the assembly 10 is presented in FIG. 7, further illustrating a sealant 50 placed in the recess 26 to partially or entirely encase the die 16, thereby protect the die 16. A thermally-conductive epoxy may be used for the sealant, thus providing heat dissipation from the die 16 to the mount 12.

Referring now to FIGS. 8-11, an alternative implementation of the present teachings includes a lens array 52 located between the substrate 14 and the MT connector 18. The lens array 52 includes a plurality of alignment pin holes that are generally in registry with the alignment pin holes 20 of the mount 12 and the alignment pin holes 34 of the substrate 14 when assembled. The lens array 52 is not necessary for operation of the optical assembly 10, but in certain implementations may improve the efficiency of the assembly 10 by, for example, focusing light emitted from the die 16 into each fiber (or vice versa) so that the light is within the numerical aperture of the fiber. The lens array 52 may also be used to focus light passing into the optical signal interface of the die 16. It will be appreciated that use of the lens array 52 increases the margin of error in the manufacture and assembly of the various components of the assembly 10. If an optical signal originating from the die 16 is focused by the lens array 52, for example, the assembly 10 is more tolerant of misalignment errors between the die 16 and the MT connector 18.

The shape and size of the lens array 52 may vary from one implementation to another according to the requirements of each implementation. In an exemplary implementation, however, the length of the lens array 52 is about 6.4 mm and the width is about 2.5 mm. The thickness is preferably within the range of from about 0.05 mm to about 0.11 mm; more preferably from about 0.06 mm to about 0.10 mm; even more preferably from about 0.07 mm to about 0.09 mm; and most preferably about 0.08 mm. The center-to-center distance between consecutive lenses may be 0.25 mm, and the diameter of each lens may be 0.24 mm.

The optical assembly 10 is assembled by first bonding the optical die 16 to the die bonding pads 40 of the substrate 14. This involves aligning the optical die 16 with the bonding pads 40 such that the solder beads 46 of the die 16 correspond to the die bonding pads 40. The optical die 16 and substrate 14 are then heated sufficiently to cause the solder beads 46 to reflow and then allowed to cool, thereby bonding the optical die 16 to the die bonding elements 40 of the substrate 14. This process is often referred to as "flip-chip" bonding and is advantageous over other methods because, for example, the entire die 16 is bonded to the substrate 14 in a single process.

A sealant 50, such as an epoxy coating, is then applied to the optical die 16 to at least partially encase and protect the optical die 16. If a thermally-conducting epoxy is used as the sealant 50, it would further dissipate heat away from the die 16. The first side 36 of the substrate 14 (to which optical die 16 is bonded), is then bonded to the first side 24 of the mount 12 so that the optical die 16 is generally within the recess 26 of the mount 12. Thus, the optical die 16 will be at least partially enclosed by the mount 12 for protection. The substrate 14 may be bonded to the mount 12 using, for example, an epoxy. As illustrated in FIGS. 1, 2, 8, and 10, the external bonding elements 42 are exposed when the substrate 14 is bonded to the mount 12, thus facilitating attachment of the external bonding elements 42 to an external structure.

The mount 12 may then be permanently or removably attached to an external structure, such as an external printed circuit board, using, for example, the mounting holes 22 of the mount 12. Alternatively, the external bonding pads 42 of the substrate 14 may be bonded to a portion of the external structure. The MT optical connector 18 may be permanently or removably attached to the second side 38 of the substrate 14, wherein alignment pins extend through the alignment pin holes 20 of the mount 12 and the alignment pin holes 34 of the substrate 14, to ensure that the optical fibers of the MT connector are in registry with the optical apertures 32 of the substrate 14 and the optical apertures 48 of the optical die 16.

Although the present teachings have been set forth with reference to particular implementations illustrated in the attached drawings, it is noted that equivalents may be employed and substitutions made herein without departing from the scope of the claimed subject matter. It will be appreciated, for example, that the principles of the present teachings are independent of the shapes and dimensions of the various components of the optical assembly illustrated and described herein, and that components of other shapes and sizes are within the ambit of the claimed subject matter.

The invention claimed is:

1. An optical assembly comprising:
   a rigid mount with a recess proximate a first side;
   a substrate secured to the first side of the mount, the substrate including one or more die bonding elements, one or more optical apertures, and one or more external bonding elements, at least one of the die bonding elements in electrical communication with at least one of the external bonding elements; and
   an optical die including a plurality of optical elements, each element including an optical signal interface, the die being bonded to the at least one die bonding elements of the substrate such that the optical signal interface of each element is in registry with an optical aperture of the substrate and the die is at least partially enclosed by the recess.

2. The optical assembly as set forth in claim 1, the mount including at least one mounting hole for securing the mount to an external object.

3. The optical assembly as set forth in claim 1, the mount and the substrate each including at least one alignment pin hole, wherein the at least one alignment pin hole of the mount is in register with the at least one alignment pin hole of the substrate.

4. The optical assembly as set forth in claim 1, the substrate having a thickness within the range of from about 0.025 mm to about 1.27 mm.

5. The optical assembly as set forth in claim 1, the substrate having a thickness within the range of from about 0.051 mm to about 1.02 mm.

6. The optical assembly as set forth in claim 1, the substrate having a thickness within the range of from about 0.076 mm to about 0.76 mm.

7. The optical assembly as set forth in claim 1, the substrate having a thickness of about 0.152 mm.

8. The optical assembly as set forth in claim 1, the optical die being monolithic.

9. The optical assembly as set forth in claim 1, each optical aperture of the substrate having a diameter within the range of from about 0.025 mm to about 0.49 mm.

10. The optical assembly as set forth in claim 1, each optical aperture of the substrate having a diameter within the range of from about 0.051 mm to about 0.038 mm.

11. The optical assembly as set forth in claim 1, each optical aperture of the substrate having a diameter within the range of from about 0.076 mm to about 0.25 mm.

12. The optical assembly as set forth in claim 1, each optical aperture of the substrate having a diameter of about 0.152 mm.

13. The optical assembly as set forth in claim 1, further comprising a lens array for focusing light passing through the one or more optical apertures of the substrate.

14. An optical assembly comprising:
- a rigid mount comprising—
  - a plurality of alignment pin holes, and
  - a recess on a first side of the mount;
- a substrate secured to the mount, the substrate comprising—
  - a plurality of alignment pin holes in registry with the alignment pin holes of the mount,
  - a plurality of optical apertures,
  - a first side connected to the mount,
  - a plurality of die bonding pads on the first side,
  - a plurality of external bonding pads, and
  - a plurality of electrical traces connecting at least some of the die bonding pads to at least some of the external bonding pads; and
- an optical die with a plurality of optical elements bonded to the die bonding pads of the substrate such that an optical aperture of each optical element is in registry with one of the plurality of optical apertures of the substrate, the optical die array being at least partially enclosed by the cavity of the mount.

15. The optical assembly as set forth in claim 14, the optical die array including at least one optical-to-electrical transducer.

16. The optical assembly as set forth in claim 14, the optical die array including at least one electrical-to-optical transducer.

17. The optical assembly as set forth in claim 14, the rigid mount further comprising a plurality of mounting holes.

18. The optical assembly as set forth in claim 14, further comprising a lens array attached to a second side of the substrate opposite the first side of the substrate.

19. The optical assembly as set forth in claim 14, the optical die array being monolithic.

20. The optical assembly as set forth in claim 14, the substrate being chosen from the group consisting of a printed circuit board, a thin film network, a thick film network, and a low temperature co-fired ceramic (LTCC) material.

21. A method of assembling an optical assembly, the method comprising:
- positioning a optical die on a substrate such that one or more solder beads of the die align with one or more die bonding pads of the substrate and an optical signal interface of the optical die is in registry with an optical aperture of the substrate;
- heating the die and the substrate such that the solder beads reflow and secure the die to the substrate;
- bonding the substrate to a rigid mount such that the die is at least partially enclosed by a recess of the mount;
- connecting external bonding pads of the substrate to an external circuit such that the optical die is in electrical communication with the external circuit; and
- connecting an optical MT connector to the substrate such that the MT connector is in optical communication with the die via the optical aperture.

22. The method as set forth in claim 21, further comprising inserting alignment pins through alignment pin holes of the mount, alignment pin holes of the substrate, and alignment pin holes of the MT connector.

23. The method as set forth in claim 21, further comprising filling the recess of the mount with a sealant to substantially entirely encase the die in the sealant.

24. The method as set forth in claim 21, further comprising filling the recess of the mount with a thermally-conductive sealant to substantially entirely encase the die in the sealant.

* * * * *

UNITED STATES PATENT AND TRADEMARK OFFICE
CERTIFICATE OF CORRECTION

PATENT NO. : 7,350,985 B2  Page 1 of 1
APPLICATION NO. : 11/690495
DATED : April 1, 2008
INVENTOR(S) : Daric Laughlin et al.

It is certified that error appears in the above-identified patent and that said Letters Patent is hereby corrected as shown below:

Title Page, Item (73) Assignee:

Delete "MI" and insert -- MO --.

Signed and Sealed this

Eighth Day of July, 2008

JON W. DUDAS
*Director of the United States Patent and Trademark Office*